United States Patent [19]

Darveaux

[11] Patent Number: 5,552,636
[45] Date of Patent: Sep. 3, 1996

[54] DISCRETE TRANSITOR ASSEMBLY

[75] Inventor: Robert F. Darveaux, Coral Springs, Fla.

[73] Assignee: Motorola, Inc., Schaumburg, Ill.

[21] Appl. No.: 345,979

[22] Filed: Nov. 28, 1994

Related U.S. Application Data

[63] Continuation of Ser. No. 69,332, Jun. 1, 1993, abandoned.
[51] Int. Cl.$^6$ .................... H01L 23/043; H01L 23/10
[52] U.S. Cl. .................... 257/709; 257/717; 257/924; 361/714; 361/719; 361/734
[58] Field of Search .................... 257/708, 709, 257/916, 924, 774, 717; 361/714, 734, 719

[56] References Cited

U.S. PATENT DOCUMENTS

| | | | |
|---|---|---|---|
| 3,886,505 | 5/1975 | Jacobson | 257/916 |
| 4,167,647 | 9/1979 | Salera | 257/709 |
| 4,314,270 | 2/1982 | Iwatani | 257/708 |
| 4,954,878 | 9/1990 | Fox et al. | 257/774 |
| 5,031,069 | 7/1991 | Anderson | 257/916 |
| 5,103,283 | 4/1992 | Hite | 257/916 |
| 5,138,114 | 8/1992 | Breit et al. | 257/708 |
| 5,241,133 | 8/1993 | Mullen, III et al. | 257/774 |
| 5,397,917 | 3/1995 | Jimmen et al. | 257/774 |
| 5,399,903 | 3/1995 | Restnker et al. | 257/774 |

OTHER PUBLICATIONS

Motorola, Inc., RF Products Selector Guide & Cross Reference Manual, article "RF Discrete Transistors" pp. 32–33.
Motorola, Inc., Rf Products Selector Guide & Cross Reference Manual, article "RF Amplifiers" pp. 60–61.

*Primary Examiner*—Rolf Hille
*Assistant Examiner*—David Ostrowski
*Attorney, Agent, or Firm*—Andrew S. Fuller

[57] ABSTRACT

A discrete element electronic package (100) includes a heat spreader (180) with a cavity (185) for receiving a substrate (110), a substrate (110) mounted within the cavity (185) of the heat spreader (180), a heat-generating semiconductor device (170), such as a power transistor (170), mounted on the substrate (110), and electrical connectors (140) located on the substrate (110) to provide an electrical interface to the semiconductor device (170).

11 Claims, 3 Drawing Sheets

5,552,636

DISCRETE TRANSITOR ASSEMBLY

This is a continuation of application Ser. No. 08/069,332, filed Jun. 1, 1993, and now abandoned.

TECHNICAL FIELD

This invention relates in general to discrete element electronic packages, and in particular, to a discrete element power transistor package.

BACKGROUND

Large power amplifiers used in electronic devices, such as those capable of generating 100 watts of output power, are often constructed using high capacity discrete elements. An essential element is the power transistor which is used to convert an incoming signal to an amplified output signal. Because of the inherent inefficiencies of this operation, the power transistor generates large quantities of heat. This heat must be dissipated to prevent damage to the power transistor, to the surrounding electrical components, and to the electrical circuitry in general.

To ensure proper operation of the electrical circuitry, some components, such as the power transistor, must be compensated for impedance. For example, the electrical circuitry of a power amplifier may include impedance compensating circuit members, such as capacitors in close proximity to the power transistors. Location of the capacitors may be critical for the correct operation of the circuitry. In radio frequency (RF) applications, the benefits of correctly placed capacitors include maximization of RF output power and minimization of the heat dissipation requirements. Since variation of the location of these capacitors may significantly alter the characteristics of the circuitry, consistency in their placement is critical during the manufacturing process.

Large capacity power transistors are often available in packages which include a heat dissipation member, or heat spreader, and leads which provide electrical connection for input and output signals. Electrical grounding is also essential and thus leads for electrical ground connections are also included. A major problem with the current power transistor packages is the difficulty of accurately and consistently locating the capacitors for impedance compensation purposes. Usually, the arrangement of leads on such packages does not facilitate manufacturing when there is a design requirement to locate these capacitors as close as possible to the input and output leads of the power transistor device. Additionally, establishing and maintaining a thermal path from the heat spreader to other heat dissipation structures further complicates an assembly process which utilizes these devices.

Furthermore, to increase quality and reliability in the manufacturing process, and to further reduce manufacturing costs, it was long desired in the art to have these discrete elements packaged to facilitate their handling by automated part placement equipment. Thus, an improve package design is required to address the above-mentioned problems.

SUMMARY OF THE INVENTION

The invention is an electronic package which includes a thermal conductive member having a cavity located within it. A device substrate mounted within the cavity carries a heat-generating semiconductor device such as a power transistor. Electrical connection means are located on the device substrate to provide electrical connection to the device substrate.

BRIEF DESCRIPTION

DETAILED DESCRIPTION OF THE PREFERRED EMBODIMENT

Figure 3:
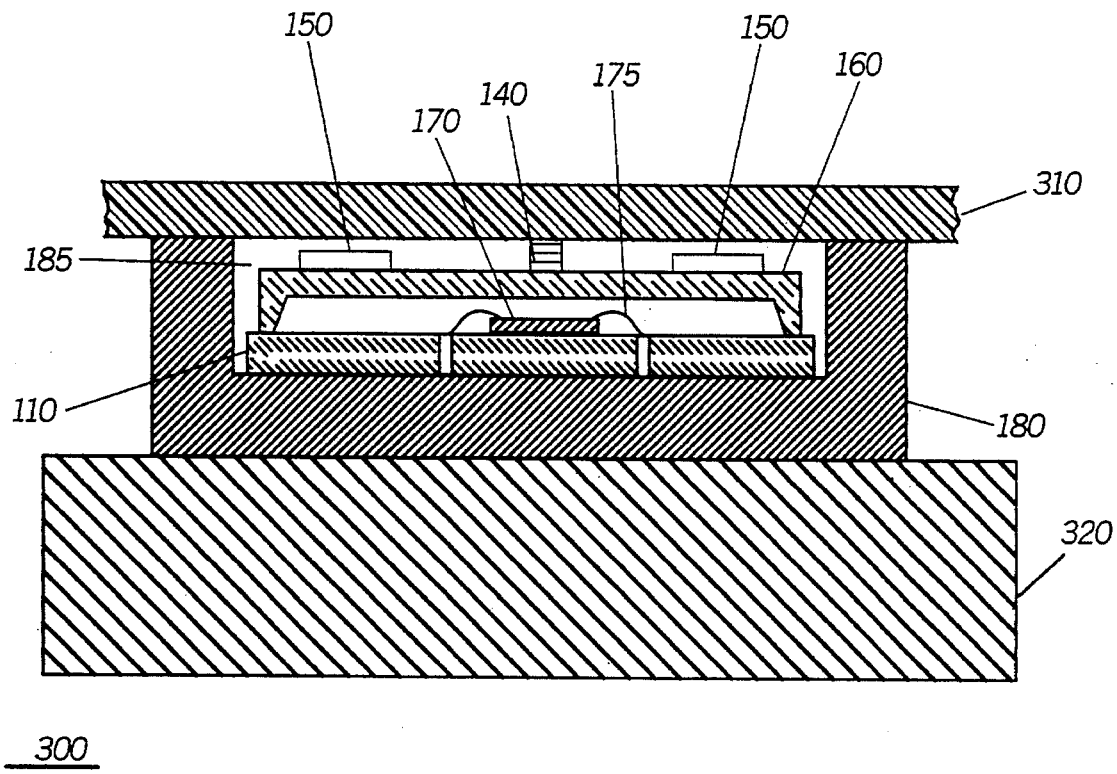
FIG. 3 is a cross-sectional view of a power amplifier assembly made in accordance with the present invention.

Referring to FIG. 3, a cross-sectional view of a power amplifier assembly 300 is shown which incorporates a transistor package made in accordance with the present invention. A device substrate 110 carries at least one power transistor 170, or other semiconductor device, which is protected by a cover 160 to prevent damage to the device 170, or to delicate wire bonds 175 used as interface connections to the device 170. Input and output leads 140 located on the device substrate 110 provide electrical connection to the substrate 110. The device substrate 110 also carries capacitors 150, which provide impedance compensation or matching for the power transistor(s) 170. The device substrate 110 is located in a cavity 185 formed within a thermal conductive member 180 ("heat spreader"). The heat spreader 180 mounts to a power amplifier module substrate 310 (which can be a printed circuit board) by soldering, or other suitable means. The input and output leads 140 electrically connect the device substrate 110 to the electrical circuitry (not shown) on the module substrate 310 of the power amplifier 300. The heat spreader 180 also thermally engages a heat dissipation structure, such as the chassis of the host device, which in the preferred embodiment is a radio frame 320. If desired, the heat spreader 180 may be thermally connected to a heat sink. Heat generated by devices 170 on the device substrate 110 is thermally conducted through the heat spreader 180 and dissipated through the host chassis 320.

Figure 1:
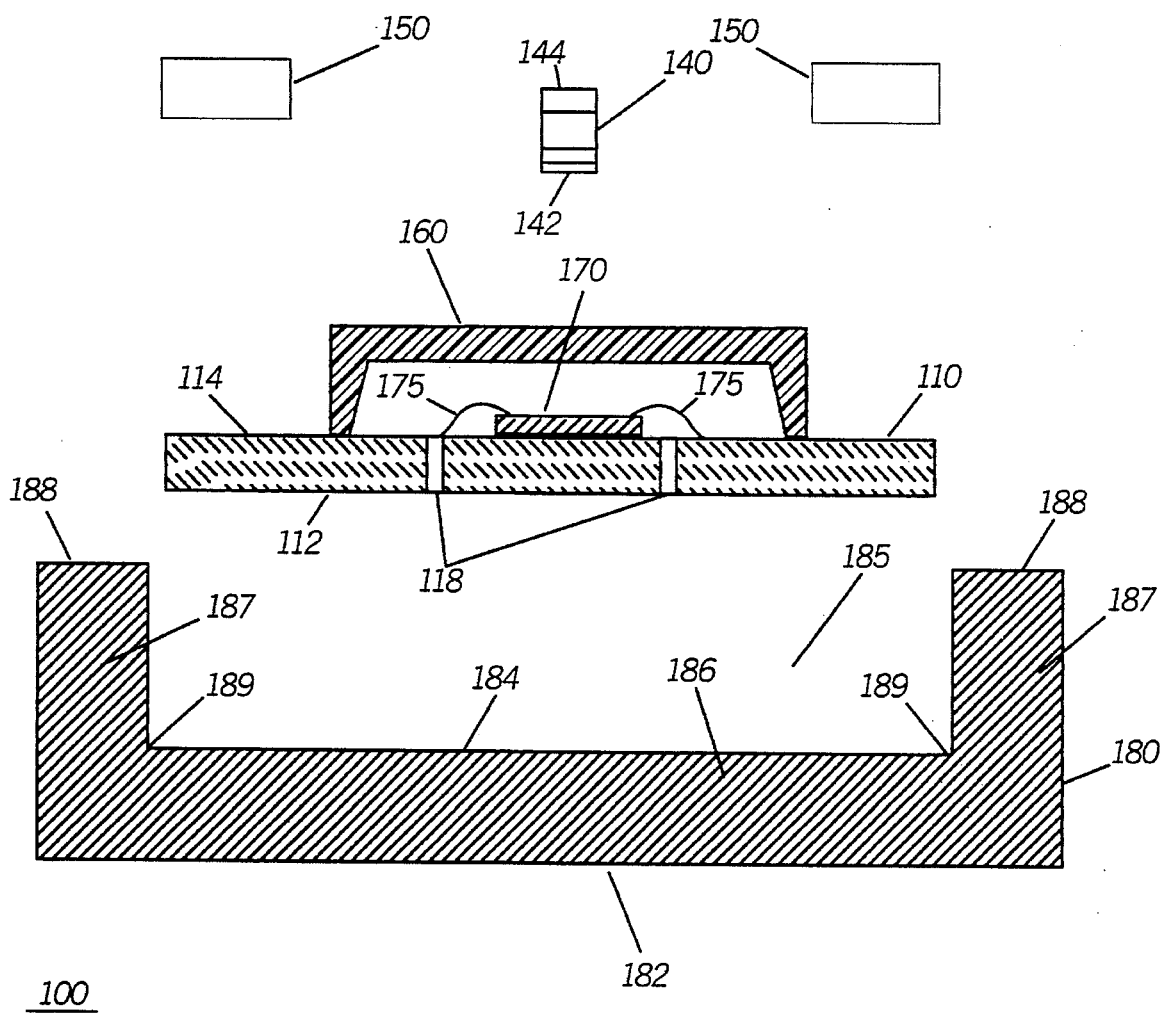
FIG. 1 is an exploded cross-sectional view of an electronic package made in accordance with the present invention.
Figure 2:
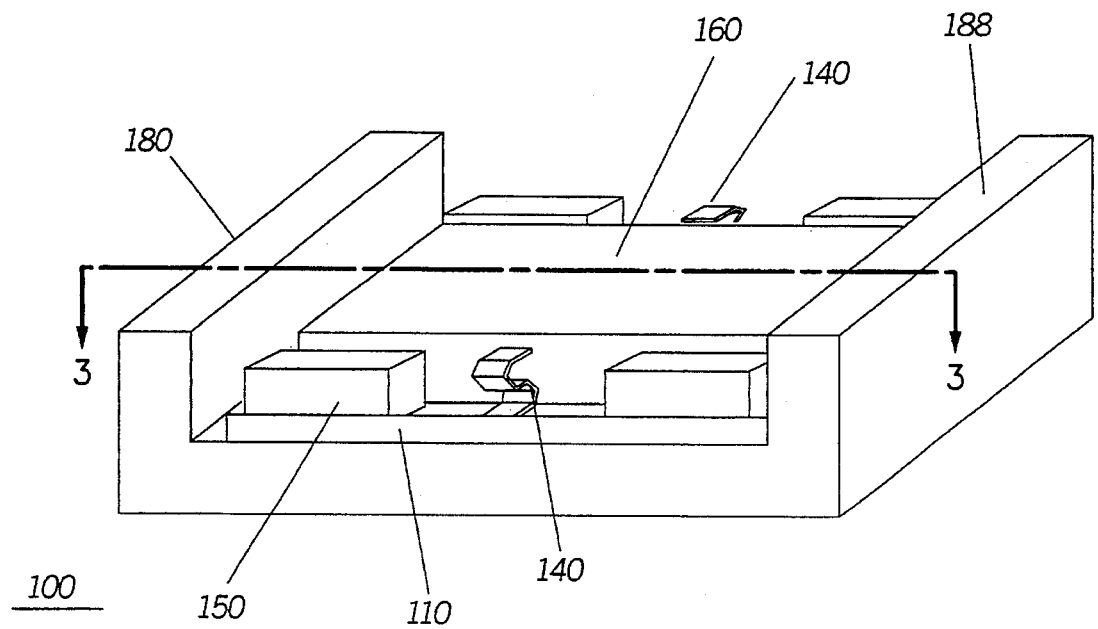
FIG. 2 is a perspective of an electronic package made in accordance with the present invention.

Referring to FIG. 1, the heat spreader 180 is a thermal conductive member formed from a material, such as copper, having good thermal conductivity. The heat spreader 180 has a general rectangular shape, having a base 186 with a planar surface 184, and two integral side walls 187 extending from the base 186. Each integral side wall 187 has one end 189 integrally attached to the base and an opposing interface end portion 188 which serves as an interface for the heat spreader 180. The base 186 together with the extending side walls 187 form a U-shape structure and define a cavity 185 extending longitudinally through the heat spreader 180. The interface end portion 188 of each side wall 187 has a planar upper surface 188 (as seen in FIG. 2). The planar upper surfaces 188 are designed to interface, by soldering or the like, with a support structure, such as the module substrate 310 for the power amplifier 300. As such, the interface design facilitates surface mounting of the heat spreader 180. Preferably, the heat spreader 180 also has good electrical conductivity to permit the heat spreader 180 to function as an electrical ground connector. The heat spreader 180 also has a planar lower surface 182 which can be used to engage the chassis 320 of the host device or any other heat dissipation path designed into the host device. Thus, the heat spreader 180 has a cavity 185 with an area sufficient to support a device substrate 110, interface portions 188 for mounting the heat spreader 180, and an area 182 for thermally engaging a structure 320 comprising a heat dissipation path.

Referring to FIG. 1, the device substrate 110 is made from a ceramic material, however, any suitable material may be used. The device substrate 110 has an upper planar surface 114 and a lower planar surface 112, and is mounted to the heat spreader 180 by soldering such that the lower planar surface 112 engages the heat spreader 180. The device substrate 110 hosts a power transistor 170, or other similar device, which is protected by a cover 160 which mounts over the power transistor 170 and onto the device substrate 110. The power transistor 170 generates heat which must be dissipated to prevent damage to the power transistor 170 or other surrounding components. Therefore, it is important that there is sufficient thermal conductivity between the power transistor 170, or other component, on the device substrate 110 and the heat spreader 180.

The power transistor 170 functions to convert an input signal into an amplified output signal. Thus, electrical connection means in the form of S-shaped flexible leads 140 are mounted to the device substrate 110 to provide electrical connection for input and output signals. A C-shaped lead, or any other flexible lead, may be used instead of the S-shaped lead 140. Preferably, the leads 140 should be oriented to face each other in order to maximize compliance thereby minimizing the stress on the mount juncture of the leads 140. Each lead 140 has two opposing ends 142,144. One end of the lead 142 is soldered to the device substrate 110, while the other end 144 serves as the electrical connection interface end, and is essentially coplanar with the interface ends 188 of the heat spreader 180 when the device substrate 110 is mounted within the heat spreader 180. The lead 140 is electrically connected to the power transistor 170 through runners (not shown) on the device substrate 110, and through the electrical connection of the runners (not shown) to the leads or wire bonds 175 on the power transistor 170. Adequate electrical grounding is also required for the device substrate 110. The use of cumbersome ground leads, which is common in the prior art, is avoided by providing electrical grounding through one or more electrically conductive paths 118 ("vias"), which extend through the device substrate 110 from the upper surface 114 of the device substrate 110 to its lower surface 112. Wire bonds 175 from the device to the vias 118 establish the required electrical ground connection. The vias 118 are in electrical contact with the heat spreader 180 which in turn is electrically grounded through its contact with the chassis 320 of the host device. Alternatively, the device substrate 110 may be electrically grounded using conductive elements or straps (not shown), which extend from the upper surface 114 of the device substrate 110 to the heat spreader 180, thus providing the necessary electrical ground connections.

When the power transistor 170 is used in power amplifier circuits, such as those amplifying signals in an RF transmitter circuit, the power transistor 170 will usually need impedance compensating circuit members, such as capacitors 150, for the circuit to properly operate. Accurate and consistent placement of these capacitors 150 is essential for correct operation of the amplification circuitry. Preferably, a portion of the device substrate 110 is available for mounting other circuit members. In the preferred embodiment, impedance compensating capacitors 150 are mounted on the device substrate 110 and electrically coupled between the device and the input and output leads 140 of the device substrate 110.

Referring again to FIG. 3, the power transistor package includes the device substrate 110 which hosts the power transistor 170. Impedance matching capacitors 150 are mounted to the device substrate 110, as are the input and output leads 140. The device substrate 110 is soldered to the heat spreader 180. The package described so far may be pre-assembled, as shown in FIG. 2, for use in the assembly of power amplifiers. The power amplifier is assembled by mounting the heat spreader 180 to the power amplifier module substrate 310, and by making electrical connections between the leads 140 of the device substrate 110 and the circuitry of the power amplifier module. It is essential that the heat spreader 180 is electrically grounded. The heat spreader 180 must also be situated to ensure that thermal contact is established and maintained between the heat spreader 180 and the chassis 320 of the host device.

Figure 4:
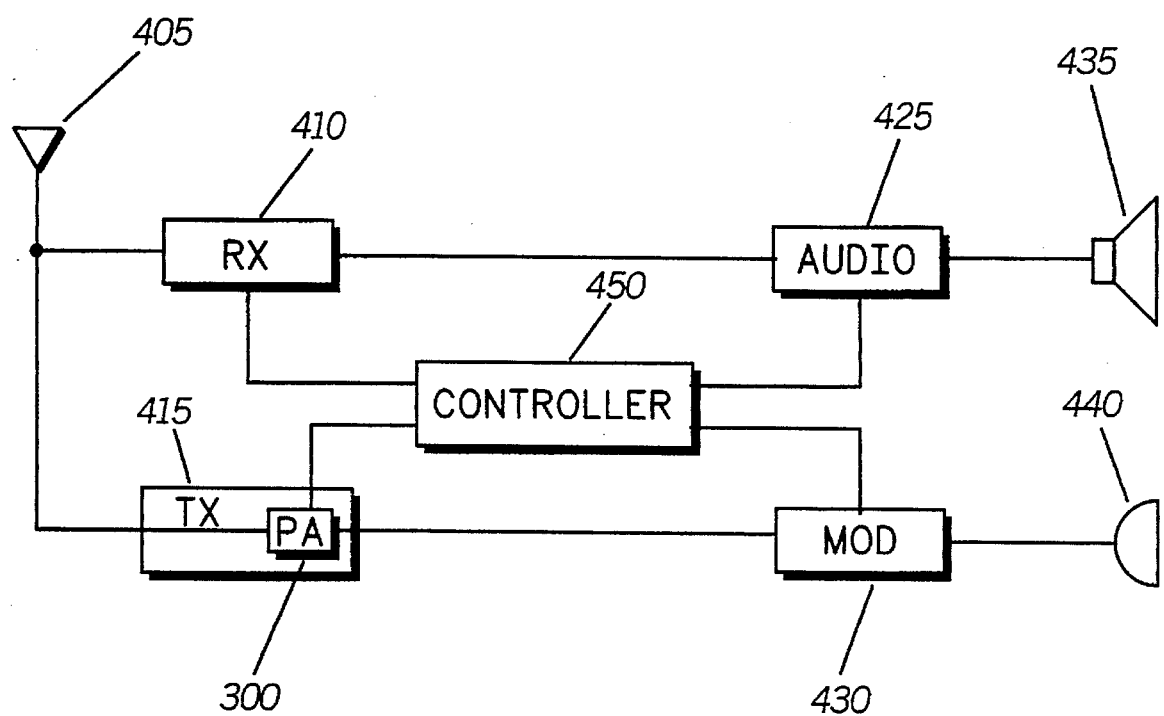
FIG. 4 is a block diagram for a radio made in accordance with the present invention.

Referring to FIG. 4, a block diagram for a radio 400 of a well known configuration is shown. The radio 400 includes a receiver section 410, a transmitter section 415, an audio section 425, a modulator 430, an antenna 405, a speaker 435, a microphone 440, and a controller 450, which comprise means for communicating signals over a RF channel. The receiver 410 receives a communication signal via the antenna 405. The output of the receiver 410 is applied to an audio section 425 which, in addition to other functions, presents messages to a user via a speaker 435. In the transmit mode, the output of a microphone 440 is applied to a well known modulator 430 which presents a modulated communication signal to the transmitter section 415. The transmitter 415, which includes a power amplifier 300 made in accordance with the present invention, transmits the communication signal via the antenna 405. The controller 450 is programmed to control the overall operation of the radio 400.

As evident from the description above, the present invention addresses many problems of the prior art. The power transistor package 100 is an impedance compensated, surface mountable package which facilitates automated assembly. The difficulty of accurately and consistently placing impedance matching capacitors has been eliminated by including the capacitors 150 within the power transistor package 100. Additionally, the highly functional design of the heat spreader 180 supports surface mounting, heat dissipation, and electrical ground connections, and also makes the package easy to handle.

What is claimed is:

1. A configurable discrete surface mountable electronic package, comprising:

a thermal conductive member with a cavity located therein, the thermal conductive member having an interface portion for mounting the electronic package;

a substrate mounted within said cavity;

a power transistor located on said substrate;

at least two flexible leads for providing electrical connection to said substrate, each lead having first and second opposing ends, the first end being attached to the substrate, the second end being an electrical interface end, the electrical interface end being substantially coplanar with the interface portion of said thermal conductive member, said electrical interface end of said lead and said interface portion of said thermal conductive member forming a substantially planar mounting surface for the electronic package;

an externally accessible mount portion for mounting impedance compensating circuitry, the externally accessible mount portion being located on said substrate between said power transistor and one of said at least two flexible leads;

an impedance compensating circuit member mounted at said mount portion.

2. An electronic package as defined in claim 1, wherein said impedance compensating circuit member comprises a capacitor.

3. An electronic package as defined in claim 1, wherein:

said thermal conductive member has a base with at least two opposing integral side walls extending from said base, said base and said at least two side walls defining said cavity within said thermal conductive member.

4. An electronic package as defined in claim 1, wherein said power transistor device is electrically connected to said thermal conductive member through a conductive via within said substrate.

5. An electronic package as defined in claim 1, wherein each of said lead is a flexible S-shaped member.

6. A configurable discrete power transistor package, comprising:

a thermal conductive member with a cavity located therein, said thermal conductive member has a base with at least two integral side walls, each side wall having first and second opposing ends, said first opposing end of each side wall integrally attached to said base, said base and said side walls defining said cavity within said thermal conductive member;

a substrate mounted within said cavity on said base, said substrate electrically connected to said thermal conductive member;

a power transistor located on said substrate;

a lead having first and second opposing ends, said first opposing end of said lead attached to said substrate, said second opposing end of said lead substantially coplanar with said second opposing end of at least one of said side walls, said lead providing a means for electrically interconnecting said substrate, said second opposing end of said lead and said second opposing end of said thermal conductive member forming a substantially planar mounting surface for the power transistor package; and an externally accessible impedance compensating circuit member mount point located on said substrate between said power transistor and one of said at least two flexible leads.

7. A power transistor package as defined in claim 6, further comprising an impedance compensating capacitor mounted at said mount point.

8. A surface mountable electronic package, comprising:

a thermal conductive member with a cavity located therein the thermal conductive member having an interface portion for mounting the electronic package;

a substrate mounted within the cavity;

a power transistor device located on the substrate;

at least two electrical connection interfaces to the substrate; and an externally accessible mount portion for mounting impedance compensating circuitry, the externally accessible mount portion being located on the substrate between the power transistor device and one of the at least two electrical connection interfaces;

wherein the at least two electrical connection interfaces form part of a surface mountable interface for the electronic package.

9. The surface mountable electronic package of claim 8, further comprising an impedance compensating circuit member mounted at the mount portion of the substrate.

10. The surface mountable electronic package of claim 9, wherein the impedance compensating circuit member comprises a capacitor.

11. The surface mountable electronic package of claim 8, further comprising a conductive via within the substrate that electrically couples the power transistor device to the thermal conductive member.

\* \* \* \* \*